(12) United States Patent
Laukkanen et al.

(10) Patent No.: US 11,443,977 B2
(45) Date of Patent: Sep. 13, 2022

(54) SILICON-ON-INSULATOR WITH CRYSTALLINE SILICON OXIDE

(71) Applicant: Turun yliopisto, Turku (FI)

(72) Inventors: Pekka Laukkanen, Turku (FI); Mikhail Kuzmin, St. Petersburg (RU); Jaakko Mäkelä, Turku (FI); Marjukka Tuominen, Raisio (FI); Marko Punkkinen, Turku (FI); Antti Lahti, Turku (FI); Kalevi Kokko, Turku (FI); Juha-Pekka Lehtiö, Turku (FI)

(73) Assignee: TURUN YLIOPISTO, Turku (FI)

( * ) Notice: Subject to any disclaimer, the term of this patent is extended or adjusted under 35 U.S.C. 154(b) by 0 days.

(21) Appl. No.: 16/611,413

(22) PCT Filed: May 30, 2018

(86) PCT No.: PCT/FI2018/050409
§ 371 (c)(1),
(2) Date: Nov. 6, 2019

(87) PCT Pub. No.: WO2018/234620
PCT Pub. Date: Dec. 27, 2018

(65) Prior Publication Data
US 2020/0105576 A1 Apr. 2, 2020

(30) Foreign Application Priority Data
Jun. 21, 2017 (FI) .................................. 20175587

(51) Int. Cl.
*H01L 21/762* (2006.01)
*H01L 21/02* (2006.01)
*H01L 23/31* (2006.01)

(52) U.S. Cl.
CPC .... *H01L 21/7624* (2013.01); *H01L 21/02238* (2013.01); *H01L 21/02255* (2013.01);
(Continued)

(58) Field of Classification Search
None
See application file for complete search history.

(56) References Cited

U.S. PATENT DOCUMENTS

| 5,338,697 A | 8/1994 | Aoki et al. |
| 5,582,640 A | 12/1996 | Okada et al. |
| (Continued) | | |

FOREIGN PATENT DOCUMENTS

| EP | 0614216 | 9/1994 |
| EP | 1102314 | 5/2001 |
| (Continued) | | |

OTHER PUBLICATIONS

FI 20175587, "FI Office Action", dated Mar. 7, 2019, 6 pages.
(Continued)

*Primary Examiner* — Hsien Ming Lee
(74) *Attorney, Agent, or Firm* — Kilpatrick Townsend & Stockton LLP

(57) ABSTRACT

A method (100) for forming a semiconductor structure (200) comprising a silicon-on-insulator layer structure with crystalline silicon oxide $SiO_x$ as the insulator material comprises: providing (120) a crystalline silicon substrate (201) having a substantially clean deposition surface (202) in a vacuum chamber; heating (130) the silicon substrate to an oxidation temperature To in the range of 550 to 1200, 550 to 1000, or 550 to 850° C.; supplying (140), while keeping the silicon substrate in the oxidation temperature, with an oxidation pressure Po in the range of $1 \cdot 10^{-8}$ to $1 \cdot 10^{-4}$ mbar in the vacuum chamber, molecular oxygen $O_2$ into the vacuum chamber with an oxygen dose $D_o$ in the range of 0.1 to 1000 Langmuir; whereby a crystalline silicon oxide layer (204) with a thickness of at least two molecular layers is formed within the silicon substrate, between a crystalline silicon base layer (203) and a crystalline silicon top layer (205).

13 Claims, 8 Drawing Sheets

(52) U.S. Cl.
CPC ...... *H01L 23/3171* (2013.01); *H01L 21/0228* (2013.01); *H01L 21/02164* (2013.01); *H01L 21/02172* (2013.01); *H01L 21/02271* (2013.01)

(56) References Cited

U.S. PATENT DOCUMENTS

| | | | |
|---|---|---|---|
| 6,255,150 | B1 | 7/2001 | Wilk et al. |
| 6,559,518 | B1* | 5/2003 | Niwa ............... H01L 21/28185 257/401 |
| 6,797,323 | B1* | 9/2004 | Kashiwagi ........ H01L 21/02255 427/255.29 |
| 2002/0024152 | A1* | 2/2002 | Momoi ............... H01L 21/3226 257/347 |
| 2003/0073278 | A1* | 4/2003 | Ohmi ...................... C30B 23/02 438/225 |
| 2004/0002200 | A1* | 1/2004 | Koveshnikov .... H01L 21/32105 438/479 |
| 2006/0003500 | A1 | 1/2006 | Wang et al. |
| 2006/0118918 | A1* | 6/2006 | Waite ............. H01L 21/823481 257/627 |
| 2007/0216042 | A1* | 9/2007 | Delprat ............. H01L 21/76254 257/E21.568 |
| 2008/0054269 | A1* | 3/2008 | Yamazaki ........... H01L 27/1266 257/E29.295 |
| 2008/0200038 | A1 | 8/2008 | Ikeuchi et al. |
| 2011/0111580 | A1* | 5/2011 | Aoyama ......... H01L 21/823807 257/E21.09 |

FOREIGN PATENT DOCUMENTS

| | | |
|---|---|---|
| JP | 2001210811 A | 8/2001 |
| JP | 2002359247 A | 12/2002 |
| JP | 2007251129 A | 9/2007 |
| RU | 2660622 C1 | 7/2018 |
| WO | 2004003996 | 1/2004 |

OTHER PUBLICATIONS

FI 20175587 , "FI Search Report", dated Dec. 22, 2017, 2 pages.
Ogawa et al., "Simultaneous observation of oxygen uptake curves and electronic states during room-temperature oxidation on Si(0 0 1) surfaces by real-time ultraviolet photoelectron spectroscopy", ScienceDirect, Surface Science, vol. 601, No. 18, Sep. 20, 2007, pp. 3838-3842.
PCT/FI2018/050409 , "International Search Report and Written Opinion", dated Sep. 3, 2018, 12 pages.
JP Application No. 2019-563794, Notice of Reasons for Rejection dated Apr. 27, 2022 (3 pages).

* cited by examiner

_US 11,443,977 B2_

SILICON-ON-INSULATOR WITH CRYSTALLINE SILICON OXIDE

CROSS-REFERENCE TO RELATED APPLICATIONS

The present application is a U.S. national phase application under 35 U.S.C. § 371 of PCT/FI2018/050409, filed on May 30, 2018, which claims the benefit of priority to FI Application No. 20175587, filed on Jun. 21, 2017, the entire contents of each of which are incorporated by reference herein for all purposes.

BACKGROUND

Silicon-on-insulator (SOI) structures may be used as substrates and building blocks for various types of semiconductor devices, such as MOSFETs and other types of transistors, and other types of microelectronic components and circuits, as well as silicon photonic components.

The quality of a SOI structure may be crucial for the performance of a device formed on such substrate. In many applications, crystalline, high quality SOI structures may result in the best device performance.

Conventionally, SOI layer structures have been manufactured by ion implantation, comprising oxygen ion bombardment of an existing silicon surface, followed by annealing. This results in formation of an amorphous silicon oxide layer within the silicon substrate. As one disadvantage, the ion bombardment affects adversely the quality of the remaining silicon layer above the silicon oxide.

In US 20060003500 A1, a method is disclosed where one atomic layer of oxygen is first deposited self-limitedly on an existing silicon surface to form one molecular layer of crystalline silicon dioxide. Thereafter, an overlaying silicon layer may be formed epitaxially on the silicon dioxide.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In one aspect, a method is disclosed for forming a semiconductor structure comprising a silicon-on-insulator layer structure with crystalline silicon oxide $SiO_x$ as the insulator material. The method comprises: providing a crystalline silicon substrate having a substantially clean deposition surface in a vacuum chamber; heating the silicon substrate to an oxidation temperature $T_o$ in the range of 550 to 1200° C.; supplying, while keeping the substrate in the oxidation temperature, with an oxidation pressure $P_o$ in the range of $1 \cdot 10^{-8}$ to $1 \cdot 10^{-4}$ mbar in the vacuum chamber, molecular oxygen $O_2$ into the vacuum chamber with an oxygen dose $D_o$ in the range of 0.1 to 1000 Langmuir (L); whereby at least part of the oxygen supplied into the vacuum chamber is adsorbed onto the deposition surface and diffuses into the silicon substrate, and a crystalline silicon oxide layer with a thickness of at least two molecular layers is formed within the silicon substrate, between a crystalline silicon base layer and a crystalline silicon top layer. In some embodiments, the oxidation temperature may lie in the range of 550 to 1000° C., or in the range of 550 to 850° C.

In another aspect, a semiconductor structure is disclosed which comprises a silicon-on-insulator layer structure with crystalline silicon oxide $SiO_x$ as the insulator material. The semiconductor structure comprises: a crystalline silicon base layer; a crystalline silicon oxide layer with a thickness of at least two molecular layers on the base layer; and a crystalline silicon top layer on the crystalline silicon oxide layer which may be formed by the above method. The semiconductor structure may be formed by the above method.

Many of the attendant features will be more readily appreciated as the same becomes better understood by reference to the following detailed description considered in connection with the accompanying drawings.

DESCRIPTION OF THE DRAWINGS

The present description will be better understood from the following detailed description read in light of the accompanying drawings, wherein.

Figure 2:
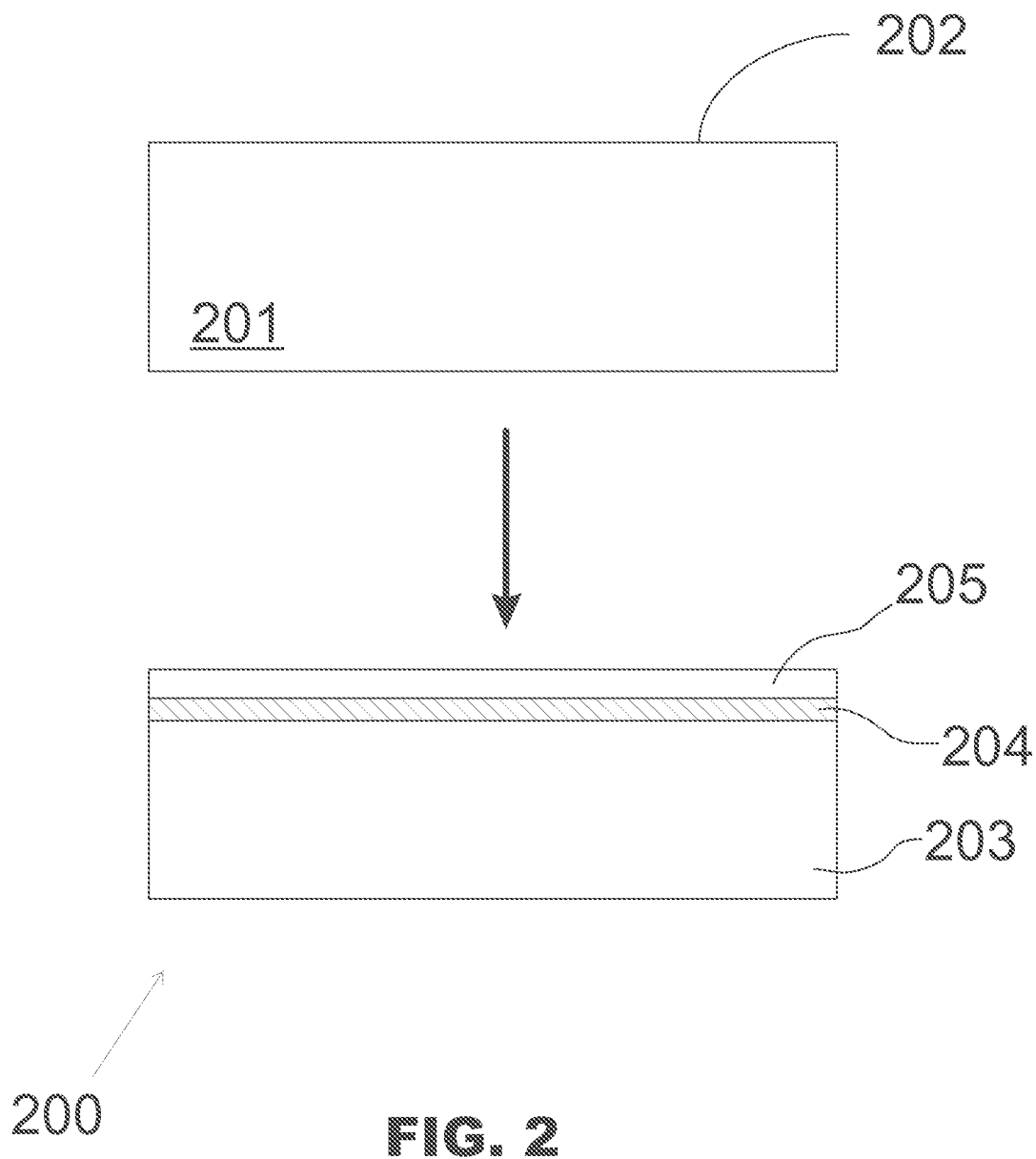
FIGS. 2 and 6 illustrate schematically semiconductor structures comprising a SOI layer structure.
Figure 6:
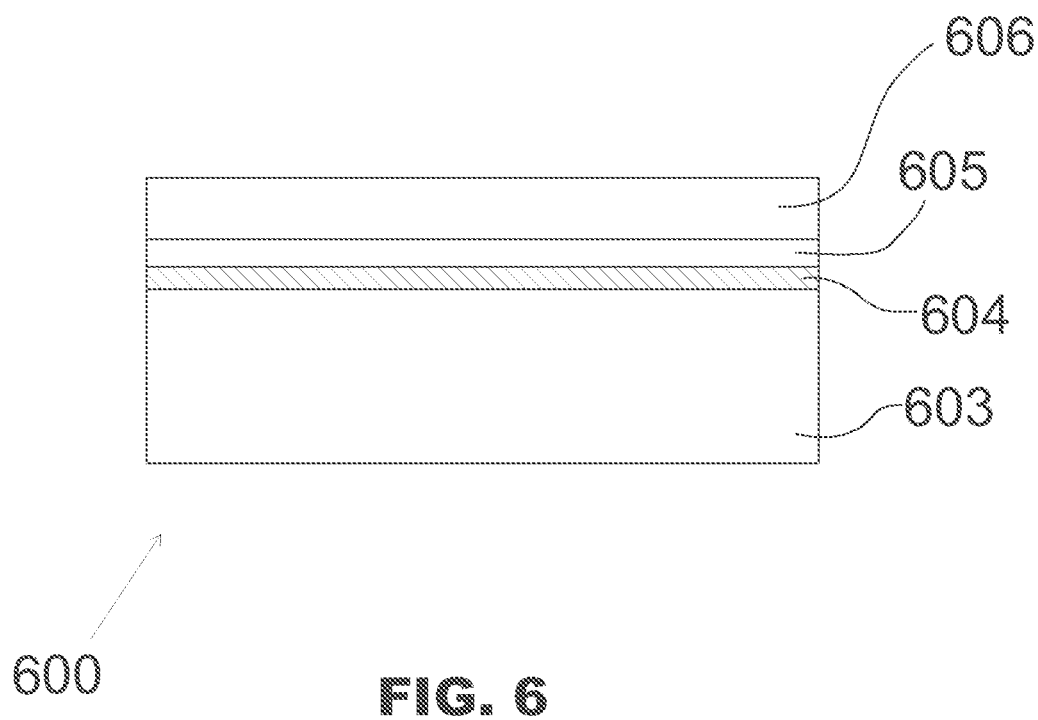

The drawings of FIGS. 2 and 6 are not in scale.

DETAILED DESCRIPTION

The detailed description provided below in connection with the appended drawings is intended as a description of a number of embodiments and is not intended to represent the only forms in which the embodiments may be constructed, implemented, or utilized.

At least some of the embodiments and examples discussed below may provide, for example, a simple, substantially single-step process for forming a high-quality SOI structure with crystalline silicon oxide as the material of the insulator layer. Further, at least some of the embodiments and examples discussed below may provide, for example, a high-quality SOI layer structure suitable for being incorporated as part of various semiconductor devices. For example, the SOI layer structure may serve as a deposition surface for depositing semiconductor device layers on it.

Figure 1:
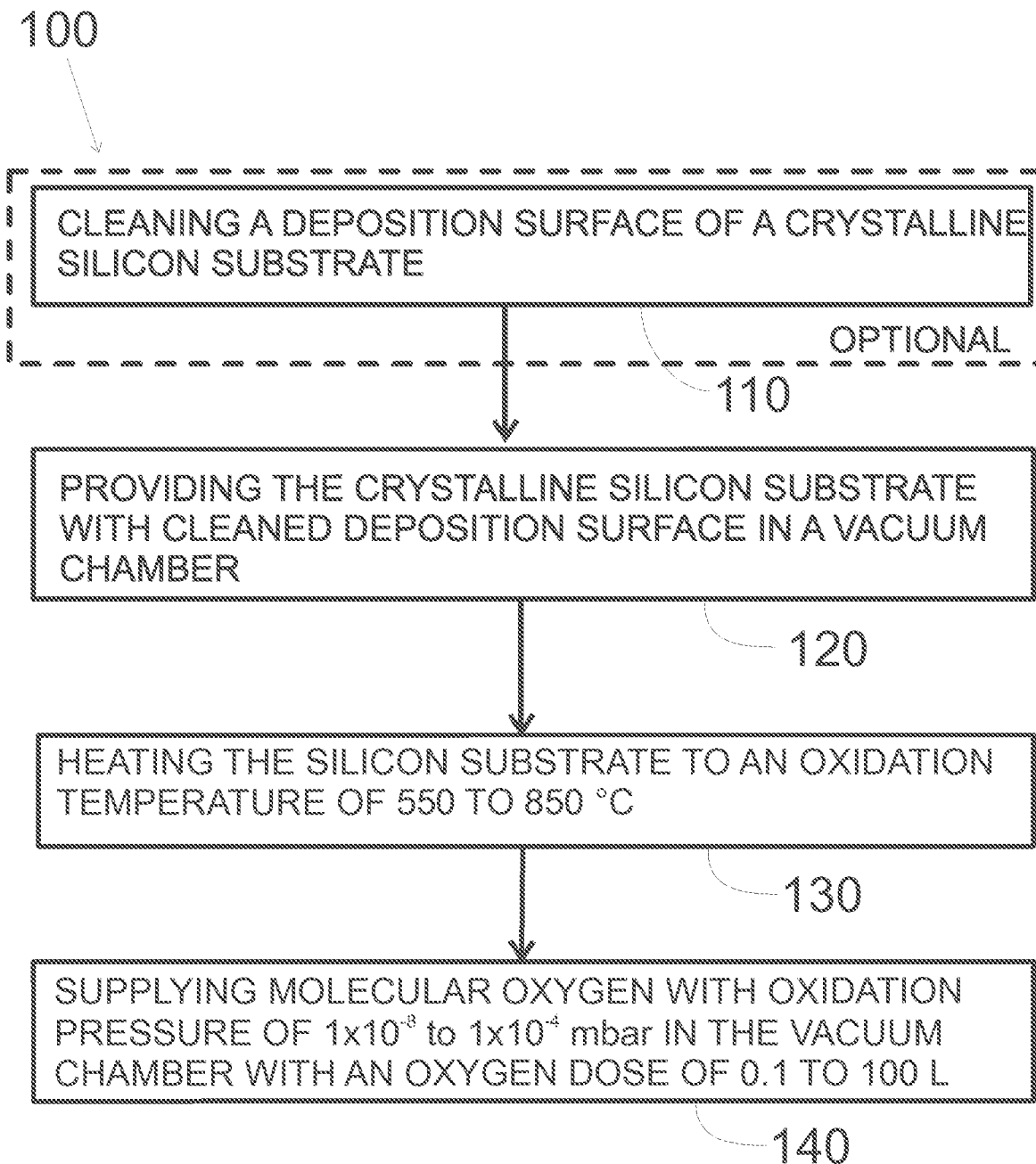
FIGS. 1, 3, and 5 show flow charts of method for manufacturing a semiconductor structure comprising a silicon-on-insulator (SOI) layer structure.

The method 100 of FIG. 1 may be used for forming a semiconductor structure which comprises a silicon-on-insulator (SOI) layer structure with crystalline silicon oxide $SiO_x$ as the material of the insulator layer. The semiconductor substrate may be in accordance with that of FIG. 2, and in the following, the method is discussed with reference to both FIG. 1 and FIG. 2.

The method comprises providing, in operation 120, a crystalline silicon substrate 201 which has a substantially clean deposition surface 202 in a vacuum chamber.

The crystalline silicon substrate may be in the form of a plain silicon wafer of any appropriate diameter and thickness. Alternatively, the silicon substrate may be formed in any other appropriate configuration, shape, and size. For example, it may be cut from or etched on a silicon wafer. The silicon substrate may be a self-supporting structure or it may be a structure attached or formed on a carrier substrate or support structure. The silicon substrate may be a part of a larger structure or assembly incorporating also parts, structures, and elements not formed of silicon.

A deposition surface refers to a surface of the silicon substrate on which additional material may be introduced and/or adsorbed. With regard to the crystal orientation, the deposition surface may be, for example, a silicon {100}, silicon {111}, or silicon {110} surface.

Being substantially clean refers to the deposition surface being substantially free of any native silicon oxide or impurity atoms of any other type. "Substantially free" means that the concentration of foreign atoms and molecules on the silicon surface does not exceed $3 \cdot 10^{13}$ cm$^{-2}$. Such substantially clean deposition surface may be provided as cleaned beforehand, i.e. before the method. Alternatively, a cleaning thereof may be included in the method, as illustrated by the optional cleaning operation 110 in the method of FIG. 1. Such cleaning may be carried out by any appropriate cleaning process.

The vacuum chamber may be any appropriate type of vacuum chamber of a system capable of producing a pressure of $1 \cdot 10^{-4}$ mbar or lower, preferably at least down to $1 \cdot 10^{-8}$ mbar, in the vacuum chamber. There may be any appropriate type of carrier or holder member on or to which the silicon substrate may be positioned or attached. Any appropriate type of heating and cooling system may be connected to such carrier or holder member to heat and cool the silicon substrate lying on it.

The method further comprises, in operation 130, heating the silicon substrate which has been provided in the vacuum chamber, to an oxidation temperature $T_o$ lying in the range of 550 to 1200° C., for example, in the range of 550 to 1000° C., 550 to 850° C., or 550 to 750° C.

In step 140, the method comprises supplying, while keeping the substrate in the oxidation temperature, molecular oxygen $O_2$ into the vacuum chamber with an oxidation pressure $P_o$ which lies in the range of $1 \cdot 10^8$ to $1 \cdot 10^{-4}$ mbar, for example, in the range of $1 \cdot 10^{-7}$ to $1 \cdot 10^{-8}$ mbar. The oxygen supply is continued until an oxygen dose in the range of 0.1 to 1000 L, for example, in the range of 5 to 300 L has been supplied into the vacuum chamber.

Those ranges specified above define a parameter space within which the actual process parameters may be selected. Thus, the method may be carried out using different combinations of the actual process parameters, i.e. the oxidation temperature, the oxidation pressure, and the oxygen dose. For example, actual process parameters may be selected within any of the following parameter sub-spaces: To=550 to 700° C., Po=$1 \cdot 10^{-7}$ to $1 \cdot 10^{-4}$ mbar, Do=10 to 50 L; To=650 to 700° C., Po=$1 \cdot 10^{-7}$ to $1 \cdot 10^{-6}$ mbar, Do=50 to 100 L; To=650 to 750° C., Po=$1 \cdot 10^{-7}$ to $5 \cdot 10^{-7}$ mbar, Do=50 to 300 L; To=700 to 750° C., Po=$1 \cdot 10^{-5}$ to $5 \cdot 10^{-5}$ mbar, Do=5 to 50 L; To=550 to 600° C., Po=$1 \cdot 10^{-7}$ to $5 \cdot 10^{-7}$ mbar, Do=5 to 75 L; and To=700 to 750° C., Po=$5 \cdot 10^{-6}$ to $1 \cdot 10^{-5}$ mbar, Do=10 to 100 L.

The duration of the oxygen supply may vary depending, for example, on the oxygen pressure and the targeted oxygen dose. The oxygen pressure, in turn, may be affected, for example, by the detailed properties of the vacuum chamber and the oxygen supply arrangement. To ensure accurate control of the oxygen dose, the molecular oxygen may be supplied into the vacuum chamber for an oxidation period which is at least 0.5 seconds, for example, at least about 1 second, preferably at least 10 seconds. Increasing the length of the oxidation period may enable better control of the oxygen dose.

As a result of said oxygen supply with said oxidation pressure, oxidation time, and oxidation temperature of the silicon substrate, the oxygen supplied into the vacuum chamber is at least partially adsorbed onto the deposition surface and diffuses into the silicon substrate. Consequently, a crystalline silicon oxide layer with a thickness of at least two molecular layers is formed within the silicon substrate, between a crystalline silicon base layer and a crystalline silicon top layer. In other words, a SOI structure with crystalline silicon oxide $SiO_x$ layer as a dielectric layer is formed below a crystalline silicon top layer. Thereby, the method comprises forming a crystalline silicon oxide layer within an existing silicon crystal, without any need, for example, for additional deposition steps to form the crystalline silicon top layer. Then, the top layer may have basically or mostly the same diamond cubic crystal structure as the base layer. "Basically" and "mostly" refer to the fact that the crystalline silicon oxide layer may have a crystal structure deviating from the diamond cubic crystal structure, and that may have some effect on the crystal structure of the silicon top layer also, at least close to the Si/$SiO_x$ interface. On the other hand, the (2×1)+(1×2) reconstruction of the free surface of the crystalline silicon top layer affects the crystal structure of the top layer close to said free surface thereof.

According to established understanding in the art, when oxidizing crystalline silicon using known methods, the oxygen incorporation sites in the crystal lie at the deposition surface; see e.g. Miyamoto et al., Physical Review B 43, 9287, 1991.

However, the above method is based on a surprising observation that with suitably selected novel combination of the oxidation parameters, oxygen adsorbed onto the deposition surface may be made diffuse through a surface or top layer of the silicon substrate so that crystalline oxide is formed within the bulk silicon crystal clearly below the deposition surface. At the same time, silicon atoms from the bulk crystal of the silicon substrate may diffuse towards the outermost surface due to the incorporation of the oxygen atoms into the silicon substrate. Such diffused silicon atoms may form new structures on the deposition surface. The crystal structure of the crystalline oxide $SiO_x$ layer may be different from the diamond lattice of bulk silicon.

The semiconductor structure 200 of FIG. 2, comprising a silicon-on-insulator (SOI) structure, may be manufactured using a method as discussed above with reference to FIG. 1. In that case, as illustrated in FIG. 2, the starting point for the manufacturing is a crystalline silicon substrate 201 having a substantially clean deposition surface 202 thereon. The semiconductor structure 200 comprises a crystalline silicon base layer 203, a crystalline silicon oxide $SiO_x$ layer 204 which widens out to a thickness of more than one molecular layer on the silicon base layer; and a crystalline silicon top layer 205 on the crystalline silicon oxide layer. The crystalline silicon top layer 205 may have basically or mostly the same diamond cubic crystal structure as the crystalline silicon base layer 203.

The accurate thickness of the crystalline $SiO_x$ layer may vary and it may have a thickness of several nanometers. When formed by a method as discussed above with reference to FIG. 1, the thickness may be affected, for example, by the oxidation temperature, the oxidation pressure, and/or the oxygen dose. The selection of the thickness may be used to tailor the band gap of the $SiO_x$ layer. For example, an increase in the band gap may advantageously provide increase in the effective insulating barrier thickness of the oxide layer. Appropriate adjustment of the thickness of the crystalline SiO$_x$ layer may be used, for example, to adjust the tunneling through SiO$_x$ layer in the semiconductor structure. This is discussed in more detail below.

In the case of semiconductor structures manufactured using a method as discussed above with reference to FIG. 1, the silicon-silicon oxide interfaces between the silicon oxide layer and the silicon base and top layers have been found to be graded instead of absolutely abruptly formed, due to the diffusion. This may advantageously result in bent energy bands at the SiO$_x$/Si interface between the silicon oxide layer and the silicon base layer, driving the charge carriers away from the interface region, which may, for example, decrease undesired surface recombination of charge carriers.

Figure 3:
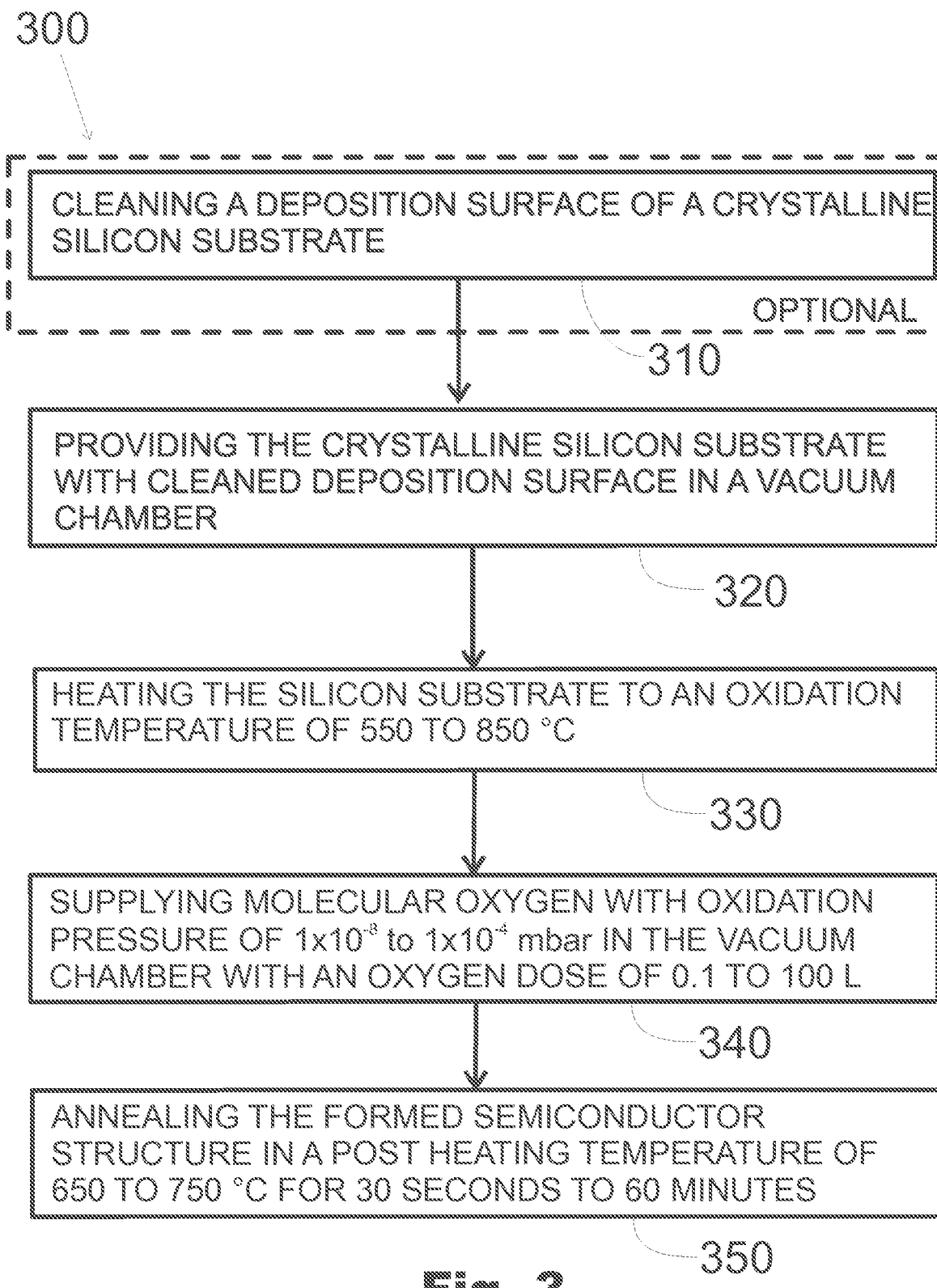

The method 300 of FIG. 3 differs from that of FIG. 1 in that it comprises an additional annealing operation 350 where the silicon substrate with the adsorbed oxygen is annealed in the vacuum chamber, after the supply of molecular oxygen, at a post heating temperature lying in the range of 650 to 750° C. to remove possible excess oxygen not contributing the formation of the crystalline silicon oxide layer. The annealing may have duration of 30 seconds to 60 minutes, for example, 5 to 20 minutes. Pressure of $10^{-8}$ mbar or less in the vacuum chamber may be used during the annealing.

Before the annealing, the semiconductor structure formed in the operations of 310 or 320 to 340 may be cooled to a temperature which substantially lower than the oxidation and post heating temperatures. Alternatively, the temperature of the silicon substrate/semiconductor structure may be adjusted directly from the oxidation temperature to the post heating temperature. In the case the oxidation temperature is equal to the post heating temperature, no adjustment is needed.

Feasibility of the methods discussed above was tested by oxidation procedure examples.

In first example, a 5 mm×10 mm rectangular Si sample was cut from an n-type Si (100) wafer to serve as a crystalline silicon substrate with a Si (100) deposition surface. The Si sample was attached via its shorter edges on a sample holder made of Mo and allowing direct current feeding through the Si sample. The sample holder was transferred into a manipulator located in a vacuum chamber of a multi-chamber vacuum system, and the Si sample was repeatedly rapidly heated up to a cleaning temperature of 1100 to 1200° C. to remove the native oxide and carbon contaminants from the Si (100) deposition surface. X-ray photoelectron spectroscopy (XPS) was used to confirm that the oxygen and carbon contaminants were effectively removed/desorbed from the deposition surface. Furthermore, low-energy electron diffraction (LEED) analysis showed a sharp (2×1)+(1×2) reconstruction arising from an inherent double-domain surface structure. Scanning-tunneling-microscopy (STM) images captured after the surface cleaning supported the presence of the double-domain reconstruction on large two-dimensional terraces.

After the cleaning phase, the Si sample with the clean Si (100) deposition surface was oxidized in the same vacuum system, using O$_2$ gas introduced into the vacuum chamber via a leak valve. Before opening the leak valve, the temperature of the Si sample was increased to a heating temperature of 670° C. Then the pressure in the vacuum chamber was increased to $1 \cdot 10^{-7}$ mbar (the pressure was measured by an ion gauge pressure meter), and the Si sample was oxidized at the heating temperature for 500 seconds, resulting in an oxidation dose of 50 Langmuir (L). Thereafter, the leak valve was closed and the Si heating was stopped simultaneously.

Figure 4:
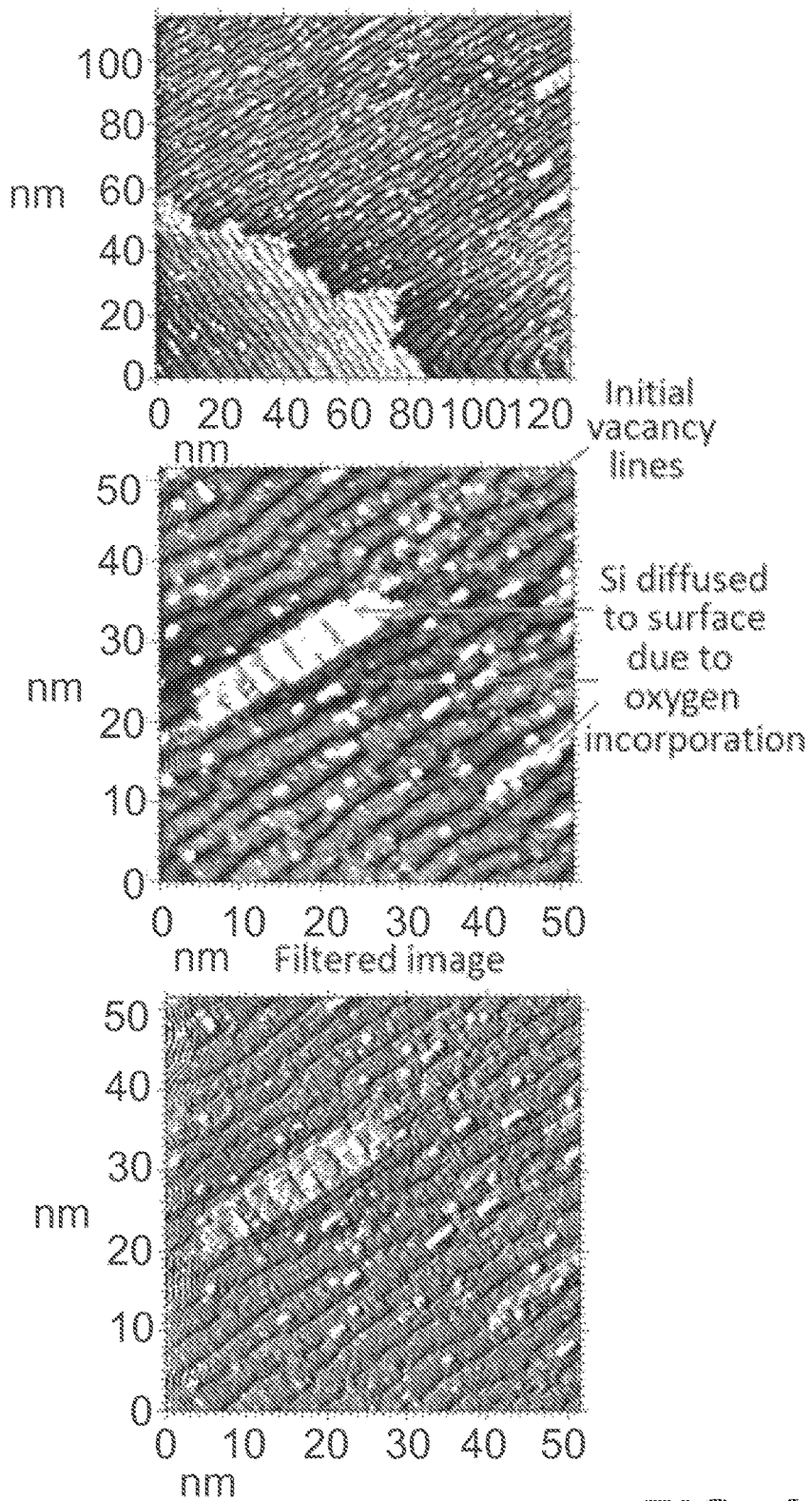
FIG. 4 shows scanning tunneling microscope images of a sample of a semiconductor structure comprising a SOI layer structure.

The STM images of FIG. 4 show the development of the surface of the Si sample during the oxidation. In the uppermost image, the deposition surface has a terrace-like or stepped micro-structure. When the oxidation proceeds, the incorporation of oxygen atoms into the Si crystal may result in diffusion of Si atoms from the bulk crystal to the deposition surface where they start to form new islands or rows with the initial (2×1) dimer-row structure, as illustrated in the middle and the lowermost images.

After completion of the oxidation of the Si sample, LEED image of the Si sample still showed a sharp (2×1)+(1×2) pattern, indicating that the outermost topmost surface layer of the sample was formed of crystalline silicon. On the other hand, O1s intensity measured from the sample by XPS clearly revealed the incorporation of oxygen atoms within the bulk silicon crystal, below the silicon top layer.

In second example, a Si sample was prepared and cleaned similarly to the first example discussed above. Oxidation was carried out basically similarly with the first example but with oxidation temperature of 600° C., using oxygen pressure of $1 \cdot 10^{-6}$ mbar and oxygen supply time of 75 s, resulting in oxygen dose of 75 L. Similarly to the first example, sharp (2×1)+(1×2) LEED pattern was observed and O1s intensity was measured by XPS, indicating formation of crystalline SOI structure also with those oxidation parameters.

Figure 7:
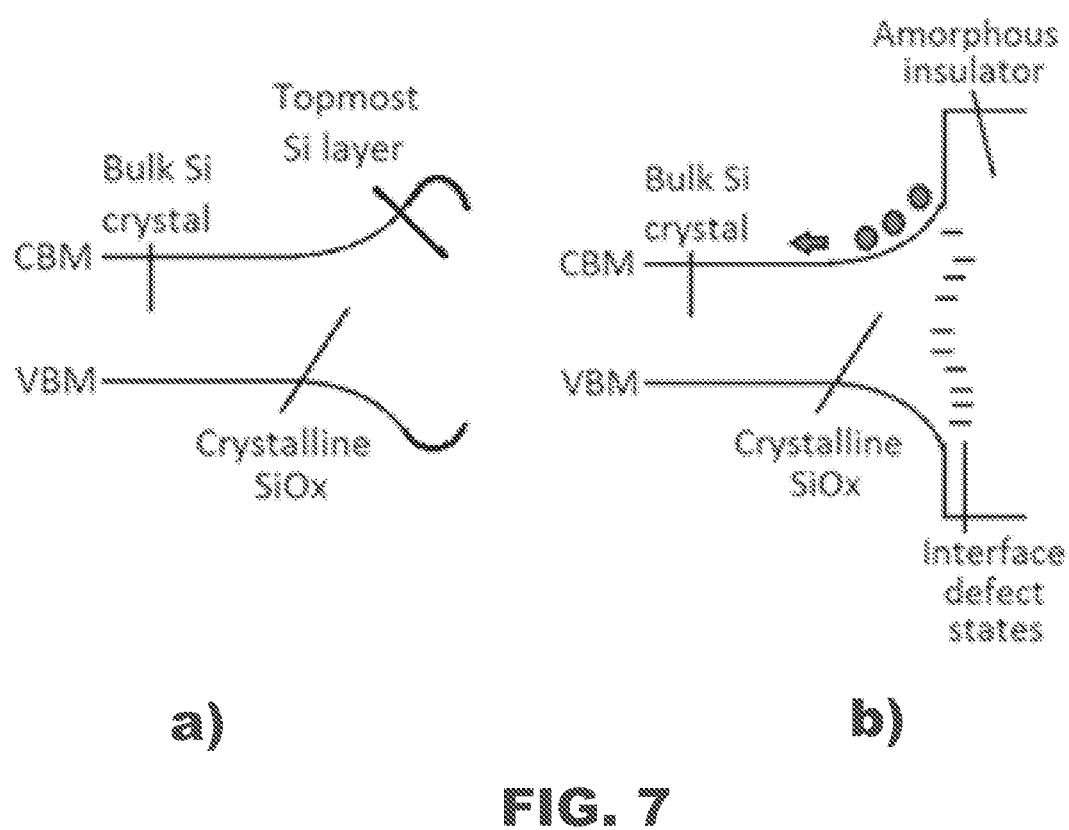
FIG. 7 shows schematically the band structure of a semiconductor structure comprising a SOI layer structure.

In third example, basically similar to the first and the second examples, oxidation was carried out with oxidation temperature of 700° C., using oxygen pressure of $1 \cdot 10^{-4}$ mbar and oxygen supply time of 1 s, resulting in an oxygen dose of about 100 to 200 L. After the oxidation, LEED image of the sample showed only a weak (1×1), indicating presence of excess oxygen, not incorporated into the Si bulk crystal and forming crystalline SiO$_x$, at the deposition surface. The sample was then annealed at a post-heating temperature of 700° C. for 10 minutes. The annealing resulted in sharp (2×1)+(1×2) LEED pattern, similar to that of FIG. 7b, and O1s intensity was measured by XPS, indicating again the formation of a crystalline silicon oxide layer beneath a crystalline silicon top layer.

Figure 5:
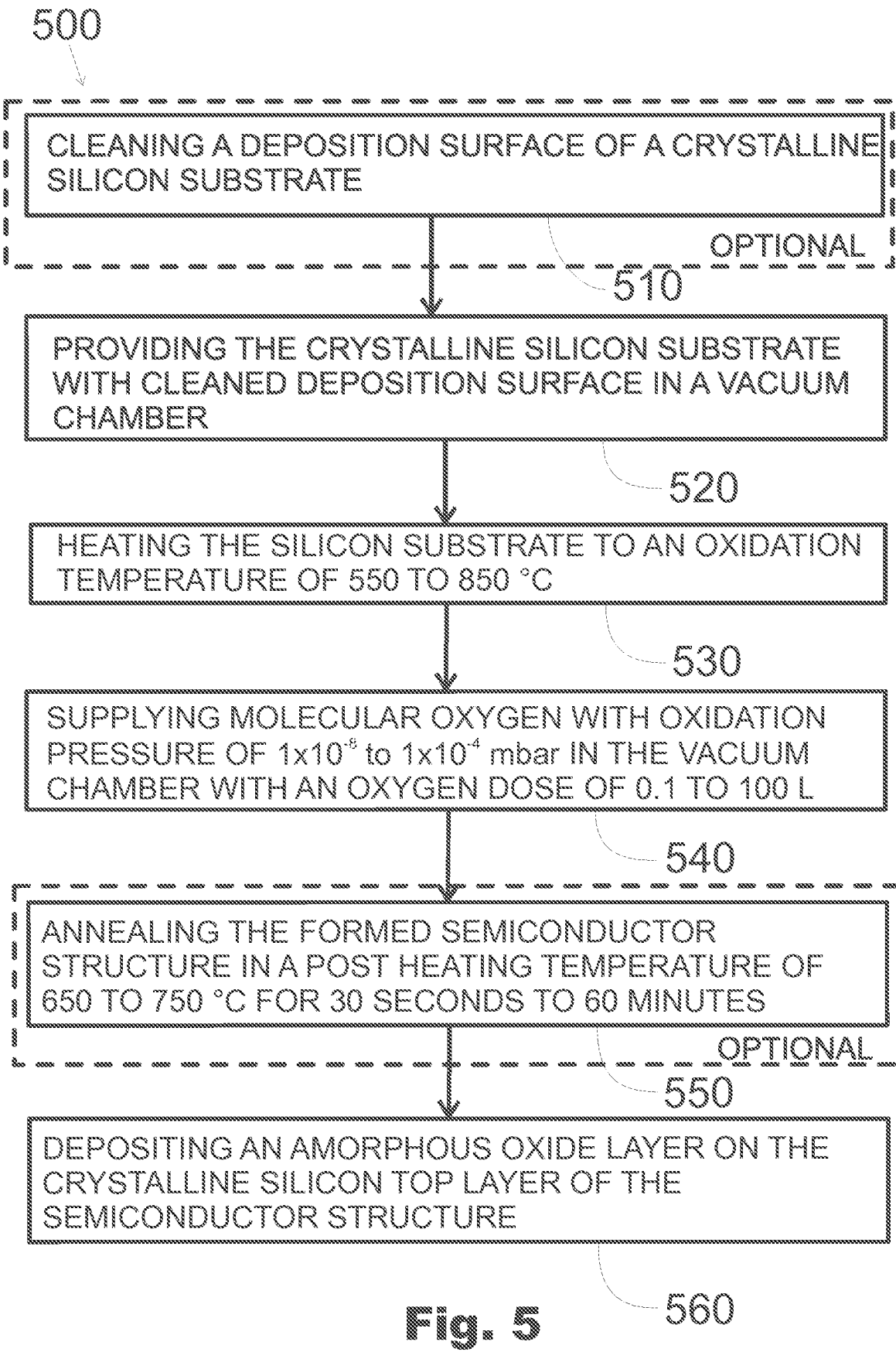

The method 500 of FIG. 5 comprises an oxidation phase which may be carried out in accordance with any of the methods discussed above with reference to FIGS. 1 and 3. It comprises the operations 520, 530, 540 of providing the crystalline silicon substrate in a vacuum chamber, heating it to an oxidation temperature, and supplying molecular oxygen into the vacuum chamber to oxidize the silicon substrate. Further, it may comprise one or both of the optional operations 510, 550 of cleaning the deposition surface of the silicon substrate, and annealing the silicon substrate with the silicon oxide layer formed therein.

Further, the method comprises, in operation 560, depositing a cap layer on the silicon top layer. The cap layer may comprise, for example, an oxide or nitride, and it may be amorphous or crystalline. The additional oxide layer may comprise, for example, silicon dioxide SiO$_2$, aluminum oxide Al$_2$O$_3$, hafnium oxide HfO$_2$, or titanium oxide TiO$_2$. In other embodiments, it may comprise, for example, mixed composition of hafnium oxide and titanium oxide HfO$_2$—TiO$_2$, zirconium oxide ZrO$_2$, cerium oxide CeO$_2$, yttrium oxide Y$_2$O$_3$, zirconium silicate ZrSiO$_4$, hafnium silicate HfSiO$_4$, aluminum oxide Al$_2$O$_3$, hafnium silicon oxynitride HfSiON, hafnium silicon nitride, lanthanum oxide La$_2$O$_3$, bismuth silicon oxide Bi$_4$Si$_2$O$_{12}$, tantalum oxide Ta$_2$O$_5$, tungsten oxide WO$_3$, lanthanum aluminum oxide LaAlO$_3$, barium strontium oxide Ba$_{1-x}$Sr$_x$O$_3$, lead (II) titanate PbTiO$_3$, barium titanate BaTiO$_3$, strontium titanate SrTiO$_3$, or any appropriate mixture thereof. The cap layer may have a thickness, for example, in the range of 1 to 500, 1 to 400, or 3 to 300 nm.

The cap layer may be deposited, for example, by atomic layer deposition ALD or chemical vapor deposition CVD. Thus, the overall method 500 may be carried out using a method in accordance with any of those discussed above with reference to FIGS. 1 and 3 for forming the SOI structure, followed by depositing the cap layer thereon, for example, by ALD or CVD.

The semiconductor structure 600 of FIG. 6 may be manufactured, for example, by the method 500 of FIG. 5. The semiconductor structure 600 comprises a SOI composition which may be in accordance with any of the semiconductor structures discussed above with reference to FIGS. 2 and 4. The SOI composition comprises a crystalline silicon base layer 603, a crystalline silicon oxide $SiO_x$ layer 604 with a thickness of at least two molecular layers on the silicon base layer; and a crystalline silicon top layer 605 on the crystalline silicon oxide layer. The semiconductor structure 600 further comprises a cap layer 606 on the crystalline silicon top layer 605. The cap layer may comprise, for example, silicon dioxide $SiO_2$, aluminum oxide $Al_2O_3$, hafnium oxide $HfO_2$, or titanium oxide $TiO_2$. In other embodiments, it may comprise, for example, mixed composition of hafnium oxide and titanium oxide $HfO_2$—$TiO_2$, zirconium oxide $ZrO_2$, cerium oxide $CeO_2$, or yttrium oxide $Y_2O_3$, zirconium silicate $ZrSiO_4$, hafnium silicate $HfSiO_4$, aluminum oxide $Al_2O_3$, hafnium silicon oxynitride HfSiON, hafnium silicon nitride, lanthanum oxide $La_2O_3$, bismuth silicon oxide $Bi_4Si_2O_{12}$, tantalum oxide $Ta_2O_5$, tungsten oxide $WO_3$, lanthanum aluminum oxide $LaAlO_3$, barium strontium oxide $Ba_{1-x}Sr_xO_3$, lead (II) titanate $PbTiO_3$, barium titanate $BaTiO_3$, strontium titanate $SrTiO_3$, or any appropriate mixture thereof. The cap layer may have a thickness, for example, in the range of 1 to 500, 1 to 400, or 3 to 300 nm.

It has been found that for a semiconductor structure manufactured using a method in accordance with any of those discussed above with reference to FIGS. 1, 3, and 5, the tunneling gap of the semiconductor structure, measurable by scanning tunneling spectroscopy (STS) is clearly higher than for a clean surface of a Si bulk sample. For example, STS analysis has shown that oxidizing a Si(100) (2×1) surface at 600° C. with as low oxygen dose as 10 L may result in a tunneling gap having a width which is four times the width of the tunneling gap of a clean non-oxidized Si (100)(2×1) reference surface. Due to the inherent property of STS being most sensitive to the outermost atomic layer of the sample to be investigated, the measured tunneling gap may be assumed not representing the $SiO_x$ gap. This assumption has been confirmed by STM analysis of samples, showing no presence of any oxygen on the surface thereof. Instead, it may be assumed that the oxygen incorporated within the bulk below the outermost Si surface causes bending of the valence and conductive bands, increasing the band gap between the conductive band minimum (CBM) and the valence band maximum (VBM) at the outermost surface layers of the oxidized Si sample comprising the SOI structure. This effect is illustrated in FIG. 7a.

The effect of such band bending on the band structure in a semiconductor structure as that of FIG. 600, comprising a cap layer on the crystalline silicon top layer, is illustrated in FIG. 7b. As known in the art, in structures with an insulating oxide layer on a crystalline Si substrate, there are typically interface defects at the insulator/Si interface. Those interface defects may cause undesired surface recombination of charge carriers. In a structure in accordance with FIG. 6, the $SiO_x$-induced increase of the band gap (and the band bending) may "repel" charge carriers from the most defect-rich region of the structure, as illustrated in FIG. 7b by small balls denoting the charge carriers, and an arrow denoting said repelling effect.

The presence of the assumed effect schematically illustrated in FIGS. 7a and 7b was investigated by analyzing, using a surface recombination velocity (SRV) instrument of Aalto University, a test sample in accordance with the semiconductor structure 600 of FIG. 6 and a reference sample. The test sample was manufactured in accordance with the method of FIG. 5 using oxidation temperature of 600° C., and the reference sample was manufactured by oxidizing a Si substrate at room temperature. The reference sample was capped with a similar amorphous $Al_2O_3$ film, serving as a cap layer, as the test sample. The test sample provided clearly higher lifetime than the reference sample, which may be seen confirming the assumed effect explained above with reference to FIGS. 7a and 7b.

In the examples discussed above with reference to FIGS. 1 to 7, planar silicon substrates with one planar deposition surface, and planar semiconductor structures with a SOI layer structure are discussed. However, the methods discussed above may also be used for oxidizing silicon substrate structures having several deposition surfaces which may be differently oriented and may have different crystal orientations. Consequently, three-dimensional SOI layer structures may be formed. Correspondingly, what is discussed above with regard to the planar semiconductor structures illustrated in FIGS. 2 and 6 may be implemented also as semiconductor structures with three-dimensional SOI layer structures.

Semiconductor structures manufactured as described above with reference to FIGS. 1, 3, and 5, as well as semiconductor structures as described above with reference to FIGS. 2, 4, and 6, may be used in any kinds of applications where SOI structures are useful. For example, those semiconductor structures may be used in field-effect transistors FETs, solar cells, and various components or barrier structures designed to guide current flow in a semiconductor device. Further, those semiconductor structures have also been found potentially useful for passivating various semiconductor surfaces.

A semiconductor structure as that illustrated in FIG. 6, having a cap layer on the crystalline silicon top layer, may be used, for example, for surface passivation and/or antireflection coating of a solar cell structure, or in the gate stack of a field-effect transistor FET. The advantageous surface recombination velocity characteristics may improve the performance of such semiconductor structures and devices. Similar semiconductor structure may also be used, for example, for electrically and/or chemically passivating a three dimensional structure, such as a nanostructure formed by etching, against changes induced by ambient conditions surrounding the structure.

In fourth example, two 5 mm×10 mm rectangular pieces were diced from an n-type Si (100) wafer to serve as a Si sample substrate and a Si reference substrate. The substrates were then cleaned in vacuum inside a vacuum chamber of a multi-chamber vacuum system by repeatedly rapidly heating them up to a cleaning temperature of 1100° C.

Following this cleaning procedure, the Si sample substrate was subjected to a heating temperature of 650° C., and an outer surface of the sample substrate was oxidized at an $O_2$ pressure of $1 \cdot 10^{-7}$ mbar, resulting in an oxidation dose of 50 L, in order to produce a SOI layer structure according to the invention, after which HfO$_2$ films with thicknesses of 25 nm were grown by ALD, using water and tetrakis(dimethylamido)hafnium(IV) (TDMAH) as the precursors, on the oxidized sample substrate and the reference substrate.

After the deposition of HfO$_2$, circular gate-metal pads with diameters of 100 microns were deposited by sputtering 10 nm of chromium followed by 50 nm of gold through a shadow mask onto the HfO$_2$ films in order to fabricate two metal-oxide-semiconductor (MOS) structures: a MOS capacitor sample and a MOS capacitor reference, comprising either the sample substrate or the reference substrate as the semiconductor, respectively. The MOS capacitor structures were then taken out of the vacuum system and connected to an LCR meter, using conductive silver paste to form back contacts.

Figure 8:
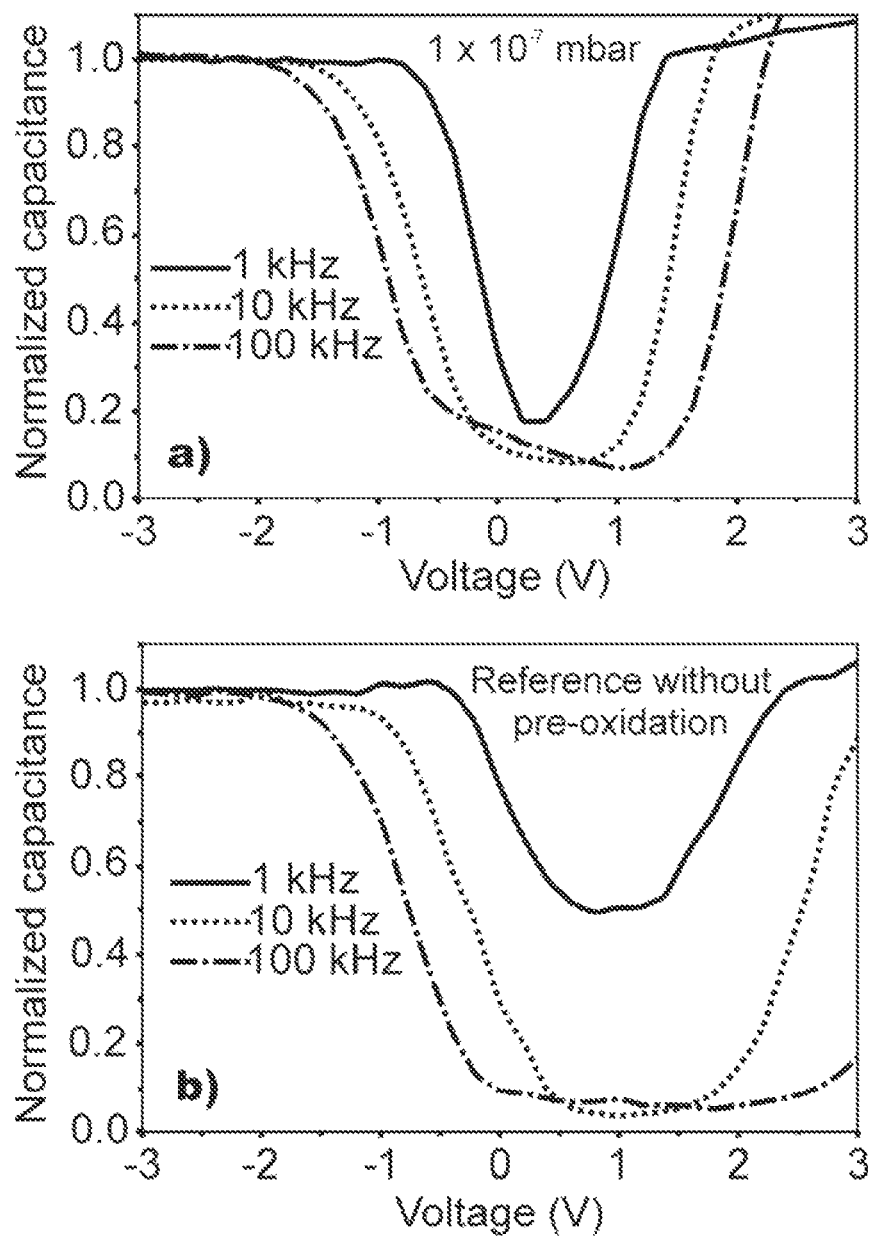
FIGS. 8 and 9 show capacitance-voltage (C-V) curves measured for metal-oxide-semiconductor (MOS) capacitor samples comprising SOI layer structures and MOS capacitor references not comprising SOI layer structures.

FIG. 8 shows capacitance-voltage (C-V) curves measured for the two different MOS capacitor structures according to the fourth example. The C-V curves in FIGS. 8a and 8b correspond to measurements conducted on the MOS capacitor sample and the MOS capacitor reference, respectively. Based on FIG. 8, it can be seen that a depletion-region capacitance step, occurring close to short-circuit conditions while shifting from negative to positive voltages, of the MOS capacitor reference is more structured (e.g., shouldered and/or gradual) than the corresponding step of the MOS capacitor sample. Such depletion region features may indicate a higher defect density in the MOS capacitor reference than in the MOS capacitor sample due to a crystalline SiO$_x$ layer embedded inside the Si sample substrate. Additionally, based on the results, the cleaning procedure conducted at a temperature of 1100° C. may have resulted in band bending in the sample and reference substrates, affecting the shapes of the C-V curves.

In fifth example, a MOS capacitor sample and a MOS capacitor reference were prepared and connected to an LCR meter similarly to the fourth example discussed above. However, in contrast to the fourth example, the step of cleaning sample and reference substrates in vacuum was replaced by a standard RCA cleaning procedure. The sample and reference substrates were also subjected to additional post-metallization annealing at a temperature of 400° C. prior to the addition of silver paste to form the back contacts.

Figure 9:
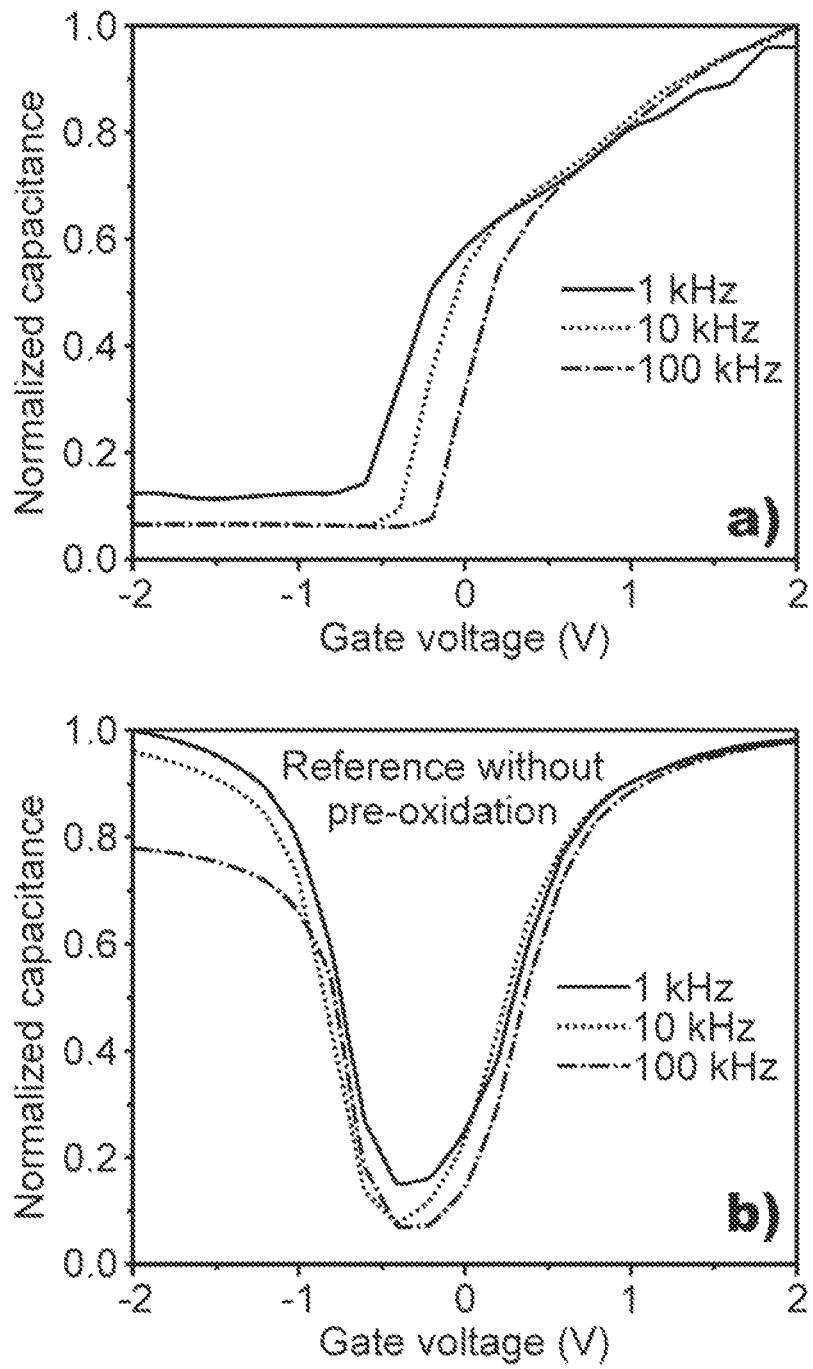

FIG. 9 shows capacitance-voltage (C-V) curves measured for the two different MOS capacitor structures according to the fifth example. The C-V curves in FIGS. 9a and 9b correspond to measurements conducted on the MOS capacitor sample and the MOS capacitor reference, respectively. In FIG. 9b, inversion capacitance of the reference sample is seen to increase at negative voltages. This may be caused by a detrimental hole-inversion layer in the MOS capacitor reference; see e.g. O'Connor et al., Journal of Applied Physics 111, 124104, 2012. The hole-inversion layer may result from an inherent fixed negative charge in HfO$_2$; see e.g. Foster et al., Physical Review Letters 89, 225901, 2002. The hole-inversion layer, which hinders switching off the MOS capacitor reference, may be removable via the provision of a SOI layer structure, as shown in FIG. 9a, due to compensating fixed positive charge of SiO$_x$; see e.g. Schmidt et al., Applied Physics A 86, 187, 2007. Such fixed positive charge in crystalline SiO$_x$ may also be utilizable in various components or barrier structures designed to guide current flow (e.g., induced p-n junctions in p-type Si or diffusion barriers for holes) in a semiconductor device (e.g., a solar cell).

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

It will be understood that the benefits and advantages described above may relate to one embodiment or may relate to several embodiments. The embodiments are not limited to those that solve any or all of the stated problems or those that have any or all of the stated benefits and advantages. It will further be understood that reference to 'an' item refers to one or more of those items.

The term "comprising" is used in this specification to mean including the feature(s) or act(s) followed thereafter, without excluding the presence of one or more additional features or acts.

It is to be noted that the embodiments of the claims are not limited to those discussed above, but further embodiments may exist within the scope of the claims.

The invention claimed is:

1. A method for forming a semiconductor structure comprising a silicon-on-insulator layer structure with crystalline silicon oxide SiO$_x$ as the insulator material, the method comprising:
   providing a crystalline silicon substrate having a substantially clean deposition surface in a vacuum chamber;
   heating the crystalline silicon substrate to an oxidation temperature T$_o$ in the range of 550 to 1200° C.; and
   supplying, while keeping the crystalline silicon substrate in the oxidation temperature, with an oxidation pressure Po in the range of $1 \cdot 10^{-8}$ to $1 \cdot 10^{-4}$ mbar in the vacuum chamber, molecular oxygen O$_2$ into the vacuum chamber with an oxygen dose D$_o$ in the range of 0.1 to 1000 Langmuir (L);
   whereby at least part of the molecular oxygen supplied into the vacuum chamber is adsorbed onto the deposition surface and diffuses into the crystalline silicon substrate, and a crystalline silicon oxide layer with a thickness of at least two molecular layers is formed within the crystalline silicon substrate, between a crystalline silicon base layer and a crystalline silicon top layer.

2. A method as defined in claim 1, wherein the oxidation temperature T$_o$ lies in the range of 550 to 750° C., the oxidation pressure P$_o$ lies in the range of $1 \cdot 10^{-7}$ to $1 \cdot 10^{-4}$ mbar, and the oxygen dose D$_o$ lies in the range of 5 to 300 L.

3. A method as defined in claim 2, wherein the oxidation temperature, the oxidation pressure, and the oxygen dose lie within one of the following parameter spaces a) to f):
   a) T$_o$=550 to 700° C., P$_o$=$1 \cdot 10^{-7}$ to $1 \cdot 10^{-4}$ mbar, D$_o$=10 to 50 L;
   b) T$_o$=650 to 700° C., P$_o$=$1 \cdot 10^{-7}$ to $1 \cdot 10^{-6}$ mbar, D$_o$=50 to 100 L;
   c) T$_o$=650 to 750° C., P$_o$=$1 \cdot 10^{-7}$ to $5 \cdot 10^{-7}$ mbar, D$_o$=50 to 300 L;
   d) T$_o$=700 to 750° C., P$_o$=$1 \cdot 10^{-5}$ to $5 \cdot 10^{-5}$ mbar, D$_o$=5 to 50 L;
   e) T$_o$=550 to 600° C., P$_o$=$1 \cdot 10^{-6}$ to $5 \cdot 10^{-7}$ mbar, D$_o$=5 to 75 L;
   f) T$_o$=700 to 750° C., P$_o$=$5 \cdot 10^{-6}$ to $1 \cdot 10^{-5}$ mbar, D$_o$=10 to 100 L.

4. A method as defined in claim 1, wherein the molecular oxygen is supplied into the vacuum chamber for an oxidation period of at least 0.5 s.

5. A method as defined in claim 1, further comprising cleaning the deposition surface by removing possible native oxide and/or impurities on the deposition surface of the crystalline silicon substrate therefrom before supplying the molecular oxygen into the vacuum chamber.

6. A method as specified in claim 1, wherein the deposition surface is a silicon {100}, silicon {111}, or silicon {110} surface.

7. A method as specified in claim 1, further comprising annealing the crystalline silicon substrate, after supplying the molecular oxygen, at a post heating temperature in the range of 650 to 750° C. for 30 seconds to 60 minutes to remove possible excess oxygen not contained in the crystalline silicon oxide layer.

8. A method as defined in claim 1, further comprising depositing a cap layer on the crystalline silicon top layer, the cap layer comprising, silicon dioxide $SiO_2$, aluminum oxide $Al_2O_3$, hafnium oxide $HfO_2$, or titanium oxide $TiO_2$.

9. A method as defined in claim 8, wherein the cap layer is deposited so as to have a thickness of 1 to 500 nm.

10. A method as defined in claim 1, wherein the deposition surface is planar.

11. A method as defined in claim 1, wherein the oxidation temperature $T_o$ is in the range of 550 to 850° C.

12. A semiconductor structure comprising a silicon-on-insulator layer structure with crystalline silicon oxide $SiO_x$ as the insulator material, comprising:
  a crystalline silicon base layer;
  a crystalline silicon oxide layer, with a thickness of at least two molecular layers, on the crystalline silicon base layer; and
  a crystalline silicon top layer on the crystalline silicon oxide layer, wherein the semiconductor structure is formed by:
    providing a crystalline silicon substrate have a substantially clean deposition surface in a vacuum chamber;
    heating the crystalline silicon substrate to an oxidation temperature $T_o$ in the range of 550 to 1200° C.; and
    supplying, while keeping the crystalline silicon substrate in the oxidation temperature, with an oxidation pressure $P_o$ in the range of $1 \cdot 10^{-8}$ to $1 \cdot 10^{-4}$ mbar in the vacuum chamber, molecular oxygen $O_2$ into the vacuum chamber with an oxygen dose $D_o$ in the range of 0.1 to 1000 Langmuir;
    whereby at least part of the molecular oxygen supplied into the vacuum chamber is adsorbed onto the deposition surface and diffuses into the crystalline silicon substrate, and the crystalline silicon oxide layer is formed within the crystalline silicon substrate, between the crystalline silicon base layer and the crystalline silicon top layer.

13. A semiconductor structure as defined in claim 12, wherein the deposition surface is silicon {100}, silicon {111}, or silicon {110}.

\* \* \* \* \*